(12) United States Patent
Li et al.

(10) Patent No.: US 9,124,232 B2
(45) Date of Patent: Sep. 1, 2015

(54) GAIN CONTROLLING SYSTEM, SOUND PLAYBACK SYSTEM, AND GAIN CONTROLLING METHOD THEREOF

(71) Applicant: Princeton Technology Corporation, New Taipei (TW)

(72) Inventors: Ming-Chung Li, New Taipei (TW); Yi-Fan Shih, New Taipei (TW); I-Chi Lin, New Taipei (TW)

(73) Assignee: Princeton Technology Corporation, New Taipei (TW)

( * ) Notice: Subject to any disclaimer, the term of this patent is extended or adjusted under 35 U.S.C. 154(b) by 176 days.

(21) Appl. No.: 14/066,091

(22) Filed: Oct. 29, 2013

(65) Prior Publication Data

US 2014/0363023 A1    Dec. 11, 2014

(30) Foreign Application Priority Data

Jun. 10, 2013    (TW) .............................. 102120571 A

(51) Int. Cl.
*H03G 3/00* (2006.01)

(52) U.S. Cl.
CPC ..................................... *H03G 3/001* (2013.01)

(58) Field of Classification Search
CPC ..... H03G 3/20; H03G 3/3005; H03G 3/3089; H03G 3/32; H03G 5/005
USPC ....................................................... 381/107
See application file for complete search history.

(56) References Cited

U.S. PATENT DOCUMENTS

| | | | |
|---|---|---|---|
| 6,072,367 A * | 6/2000 | Mase | 330/278 |
| 6,298,139 B1 * | 10/2001 | Poulsen et al. | 381/107 |
| 8,116,485 B2 * | 2/2012 | Escott et al. | 381/107 |
| 8,406,431 B2 | 3/2013 | Nandury | |
| 2003/0091180 A1 | 5/2003 | Sorqvist et al. | |
| 2013/0003990 A1* | 1/2013 | Wang et al. | 381/107 |
| 2014/0363023 A1* | 12/2014 | Li et al. | 381/107 |

FOREIGN PATENT DOCUMENTS

| | | |
|---|---|---|
| CN | 102355214 A | 2/2012 |
| JP | 2004-07735 A | 1/2004 |

\* cited by examiner

*Primary Examiner* — Mark Blouin
(74) *Attorney, Agent, or Firm* — Muncy, Geissler, Olds & Lowe, P.C.

(57) ABSTRACT

A gain controlling system, a sound playback system, and a gain controlling method thereof are disclosed. The gain controlling system includes a main gain control unit, a sub gain control unit, and a logic control unit. The main gain control unit has a first step-by-step adjusting magnitude; the sub gain control unit has a second step-by-step adjusting magnitude; wherein the second step-by-step adjusting magnitude is smaller than the first step-by-step adjusting magnitude. The logic control unit is used for controlling the main and the sub gain control unit to transform an analog signal into a converted signal according to an adjustment command signal and further determining whether an adjusting magnitude required by the adjustment command signal is larger than a maximum gain range of the sub gain control unit. If yes, the logic control unit controls the main control unit and the sub gain control unit repeatedly.

16 Claims, 7 Drawing Sheets

GAIN CONTROLLING SYSTEM, SOUND PLAYBACK SYSTEM, AND GAIN CONTROLLING METHOD THEREOF

BACKGROUND OF THE INVENTION

1. Field of the Invention

The exemplary embodiment(s) of the present invention relates to a gain controlling system, a sound playback system, and a gain controlling method thereof. More specifically, the exemplary embodiment(s) of the present invention relates to a gain controlling system, a sound playback system, and a gain controlling method thereof which could improve the gain variance curve.

2. Description of the Related Art

With the improvement of the technology, various sound playing systems are widely used, such as stereo systems or computer systems that provide signals to generate sound through the speakers. In the prior arts, the sound volume of the sound signal could be adjusted by using the analog gain controller made by the passive potentiometer. The analog gain controller uses a sliding sheet to touch a thin-film resistor, and the gain magnitude is obtained according to the physical position of the sliding sheet. The potentiometer usually obtains the gain magnitude according the rotation (or sliding) made by the user, and thus the user could not hear the crackling noise.

However, in the prior arts, the computer system usually uses a digital gain control circuit to control the sound volume, as shown in FIG. 1A, which is a structure schematic diagram of the gain controlling system of the prior art.

The gain controlling system 90 comprises a signal input end 91, a signal output end 92, an operational amplifier 93 and change-over switches S1, S2 and S3. The user could obtain different sound signals with different gain by switching different change-over switches S1, S2 or S3, for example, by changing to the change-over switches S2 from the change-over switches S1. But, as shown in FIG. 1B which is a gain curve diagram showing a higher gain change magnitude according to the prior art, when the gain gap is very large and the switching operation is performed, the waveform of the gain curve C would suffer a discontinuous process, i.e. it would generate the gap point P, and thus an audible crackling noise is generated. The gain controlling system 90 of the prior art would easily generate a wobbly waveform.

Therefore, a gain controlling system, a sound playback system, and a gain controlling method thereof are needed to solve the disadvantages of the prior art.

SUMMARY OF THE INVENTION

The main object of the present invention is to provide a gain controlling system capable of improving the gain change curve.

Another object of the present invention is to provide a sound playback system having the aforementioned gain controlling system.

Still another object of the present invention is to provide a gain controlling method for being used in the aforementioned gain controlling system.

In order to achieve the aforementioned object, the gain controlling system of the present invention is used for adjusting a gain of an analog signal according to an adjustment command signal inputted from a command input end. The gain controlling system includes a main gain control unit, a sub gain control unit, and a logic control unit. The main gain control unit has a first step-by-step adjusting magnitude. The sub gain control unit is electrically connected with the main gain control unit and has a second step-by-step adjusting magnitude; wherein the second step-by-step adjusting magnitude of the sub gain control unit is smaller than the first step-by-step adjusting magnitude of the main gain control unit; wherein the analog signal is inputted to the main gain control unit and the sub gain control unit. The logic control unit is electrically connected with the main gain control unit and the sub gain control unit, and the logic control unit controls the main gain control unit and the sub gain control unit to adjust the analog signal according to the adjustment command signal, and transforms the analog signal into a converted signal; wherein after the adjustment command signal is inputted, the logic control unit further determines whether an adjusting magnitude required by the adjustment command signal is larger than a maximum gain range of the sub gain control unit. If yes, the logic control unit controls the main gain control unit and the sub gain control unit to execute the procedure of adjusting the analog signal repeatedly.

The sound playback system of the present invention comprises a signal input end, a command input end, a gain controlling system, and a signal output end. The signal input end is used for a sound signal to be inputted. The command input end is used for a user to input an adjustment command signal. The gain controlling system is electrically connected with the signal input end and the command input end, and the gain controlling system is used for adjusting the gain of the sound signal according to the adjustment command signal inputted from the command input end. The gain controlling system comprises a main gain control unit, a sub gain control unit, and a logic control unit. The main gain control unit has a first step-by-step adjusting magnitude. The sub gain control unit is electrically connected with the main gain control unit and has a second step-by-step adjusting magnitude; wherein the second step-by-step adjusting magnitude of the sub gain control unit is smaller than the first step-by-step adjusting magnitude of the main gain control unit; wherein the sound signal is inputted to the main gain control unit and the sub gain control unit. The logic control unit is electrically connected with the main gain control unit and the sub gain control unit, and the logic control unit controls the main gain control unit and the sub gain control unit to adjust the sound signal according to the adjustment command signal, and transforms the sound signal into a converted signal; wherein after the adjustment command signal is inputted, the logic control unit further determines whether an adjusting magnitude required by the adjustment command signal is larger than a maximum gain range of the sub gain control unit; if yes, the logic control unit controls the main gain control unit and the sub gain control unit to execute the procedure of adjusting the analog signal repeatedly. The signal output end is electrically connected with the gain controlling system, and the signal output end is used for outputting the converted signal.

The gain controlling method comprises the following steps: receiving the analog signal; receiving an adjustment command signal, wherein the adjustment command signal is used for adjusting the alteration magnitude of the analog signal; controlling the main gain control unit and the sub gain control unit to adjust the analog signal according to the adjustment command signal; determines whether an adjusting magnitude required by the adjustment command signal is larger than a maximum gain range of the sub gain control unit; if yes, controlling the main gain control unit and the sub gain control unit to adjust the analog signal repeatedly; and if no, outputting a converted signal.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

The aforementioned and other objectives, features, and advantages of the present invention will become more apparent from the following detailed description when taken in conjunction with the accompanying drawings.

Figure 2A:
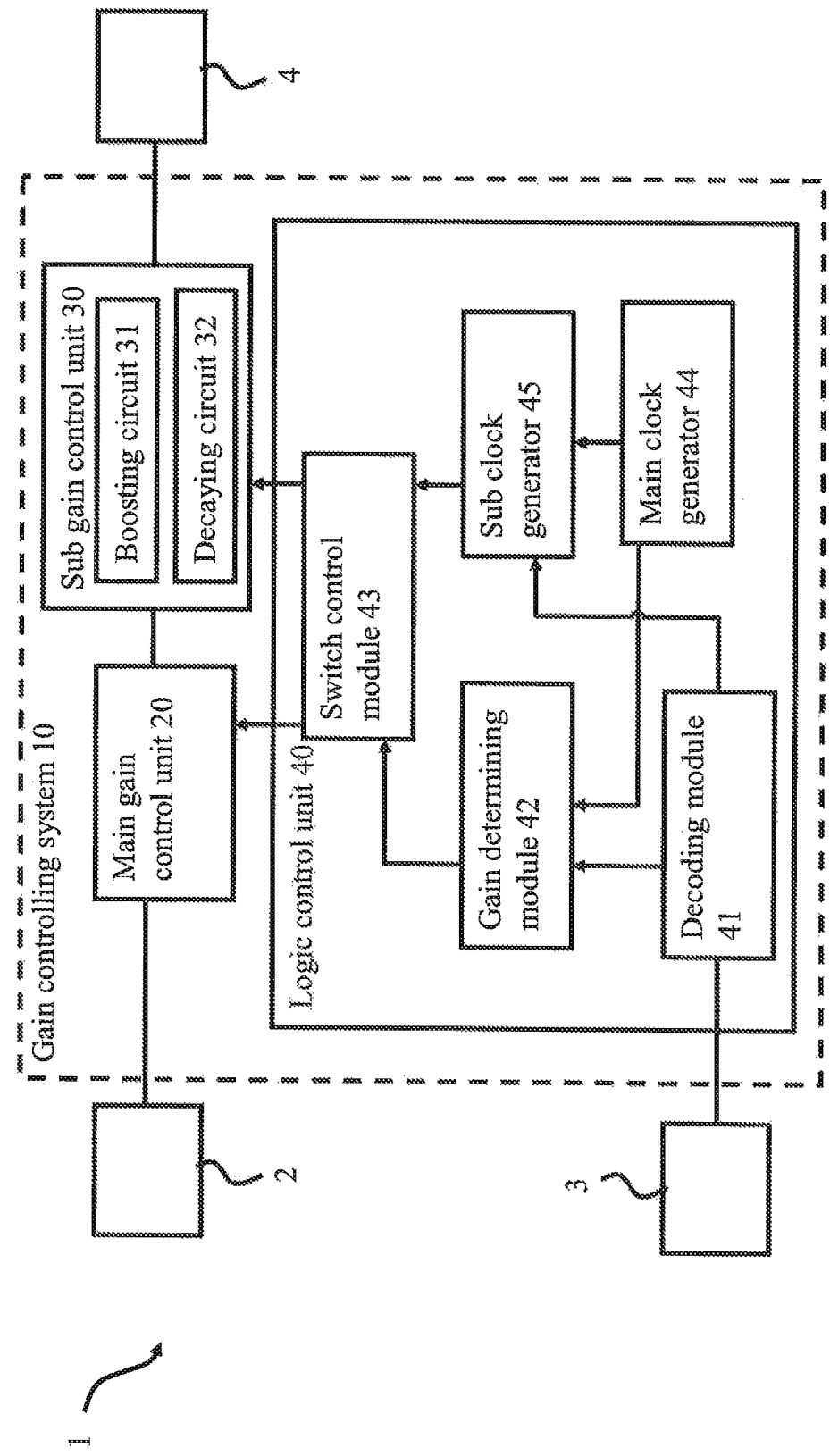
FIG. 2A is a structural schematic diagram of the gain controlling system of the present invention.

Please refer to FIG. 2A, which is a structural schematic diagram of the gain controlling system of the present invention.

The gain controlling system 10 of the present invention is used to adjust the gain of an analog signal. In one embodiment of the present invention, the gain controlling system 10 is adopted in a sound playing system 1, thus the following description would use the embodiment which takes the sound signal as the analog signal. However, the gain controlling system 10 of the present invention is not limited only to the use of adjusting the sound signal. The sound playing system 1 could be systems which could generate sound signal such as a common stereo system, a desktop computer, a laptop, or a tablet, but the present invention is not limited within the above systems. The sound playing system 1 could include a sound input end 2, a command input end 3, a signal output end 4, and a gain controlling system 10. The signal input end 2 is electrically connected to the gain controlling system 10 for allowing the sound signal to be inputted to the gain controlling system 10. After being processed by the gain controlling system 10, the sound signal would be transmitted to the signal output end 4 for being output. The signal output end 4 could be an apparatus such as a speaker. The command input end 3 could be a user operation interface installed in the sound playing system 1, which is used for the user to input an adjustment command signal to control the gain of the sound signal, i.e. to increase or decrease the volume of the sound signal.

The gain controlling system 10 comprises a main gain control unit 20, a sub gain control unit 30, and a logic control unit 40. The main gain control unit 20 has a first step-by-step adjusting magnitude, the sub gain control unit 30 has a second step-by-step adjusting magnitude, and the second step-by-step adjusting magnitude of the sub gain control unit 30 is smaller than the first step-by-step adjusting magnitude of the main gain control unit 20. Besides, the sub gain control unit 30 further comprises a boosting circuit 31 and a decaying circuit 32, which are used as the gain circuits for increasing or decreasing the sound volume respectively.

Figure 2B:
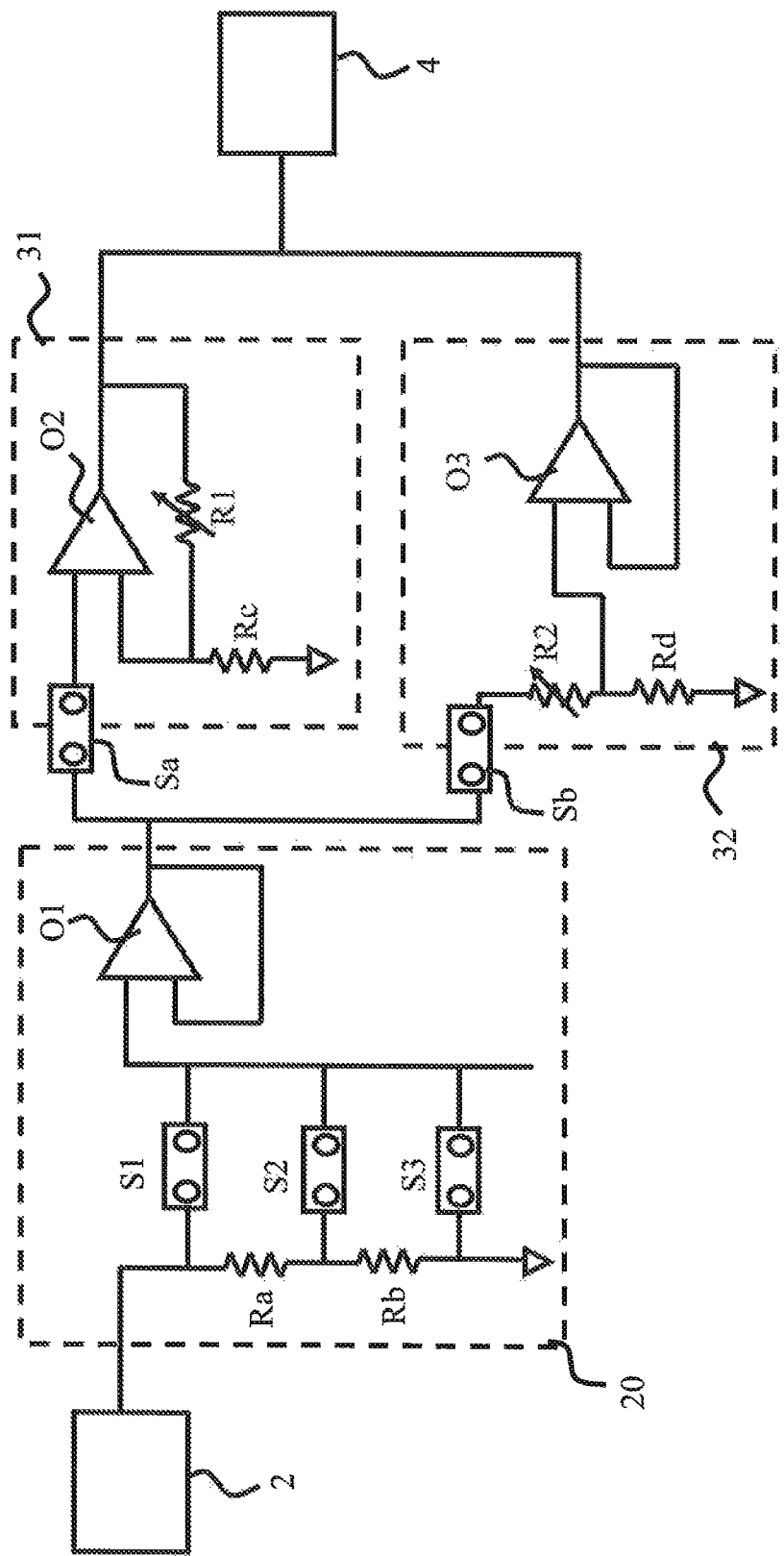
FIG. 2B is a circuit schematic diagram of the main gain control unit and the sub gain control unit of one embodiment of the present invention.

Here, please refer to FIG. 2B at the same time, which is a circuit schematic diagram of the main gain control unit and the sub gain control unit of one embodiment of the present invention.

The main gain control unit 20 includes an operational amplifier O1 and change-over switches S1, S2, and S3. The boosting circuit 31 comprises a change-over switch Sa, an operational amplifier O3, and a variable resistor R2. In addition, the main gain control unit 20, the boosting circuit 31 and the decaying circuit 32 could still comprise necessary passive devices, such as fixed resistors Ra, Rb, Rc, and Rd.

The logic control unit 40 is electrically connected with the command input end 3, the main gain control unit 20 and the sub gain control unit 30, and is used for receiving the adjustment command signal transmitted from the command input end 3, so as to control the main gain control unit 20 and the sub gain control unit 30 to adjust the gain of the sound signal. The logic control unit 40 could be structured by hardware, hardware collocated with software or hardware collocated with firmware, whilst the present invention does not limit the implementation of the logic control unit 40 to a specific form. After the sound signal is inputted to the signal input end 2, the logic control unit 40 could switch the change-over switches S1, S2, and S3, so as to obtain different gain change magnitude of the sound signal after the sound signal is processed by the operational amplifier O1. At the same time, the logic control unit 40 also determines the switching between the change-over switch Sa and the change-over switch Sb according to the determination of whether the volume of the sound signal is to be increased or decreased. If the volume of the sound signal is to be increased, the logic control unit 40 controls the change-over switch Sa to be on, and through adjusting the variable resistor R1 and the operational amplifier O2, the converted signal having an increased volume could be outputted to the signal output end 4. In addition, if the volume of the sound signal is to be decreased, the logic control unit 40 controls the change-over switch Sb and the variable resistor R2, so as to obtain the converted signal having a decreased volume by the operational amplifier O3.

Assume that each step of the gain change magnitude of the main gain control unit 20 is 1 dB, each step of the gain change magnitude of the sub gain control unit 30 is 0.05 dB, and the total magnitude is 1 dB. When the main gain control unit 20 and the sub gain control unit 30 are mixed to operate, the gain change operation time could be increased by 20 times, but each step of the gain change magnitude could be lowered to 0.05 dB. By increasing the gain change operation time, the object of lowering the switch noise could be achieved. It has to be noted here that the circuit shown in FIG. 2B is just an exemplary embodiment, the present invention is not limited to the circuitry within FIG. 2B, and those skilled in the art could clearly understand the working mechanism and other circuits which could achieve this object, thus it would not be described here in detail.

In the preferred embodiment of the present invention, the logic control unit 40 could include a decoding module 41, a gain determining module 42, a switch control module 43, a main clock generator 44, and a sub clock generator 45. The decoding module 41 is electrically connected with the command input end 3. After the adjustment command signal is inputted, the decoding module 41 is used for decoding the adjustment command signal, so as to generate an adjusting magnitude controlling signal, a single-conversion time parameter, and a single-conversion section parameter according to the adjustment command signal. The adjusting magnitude controlling signal is used to determine the gain magnitude of the sound signal; the single-conversion time parameter and the single-conversion section parameter are used to determine the section numbers and the operation time of the sub gain control unit 30. When the section number is increased, the operation time would be longer, and thus a much smoother gain change curve would be obtained.

The gain determining module 42 is electrically connected with the decoding module 41, and when the decoding module 41 obtains the adjusting magnitude controlling signal, the adjusting magnitude controlling signal would be transmitted to the gain determining module 42, thus the gain determining module 42 could obtain the sound volume of the sound signal to be increased or decreased, and the gain magnitude to be executed by the main gain control unit 20. The gain determining module 42 could also obtain the switch controlling signal. The switch controlling module 43 is electrically connected with the gain determining module 42, the main gain control unit 20, and the sub gain control unit 30, and the switch controlling module 43 controls the main gain control unit 20 and the sub gain control unit 30 to operate according to the switch controlling signal, for example, by controlling the change-over switch S1, S2, S3 in the main clock generator 44 and the change-over switch Sa and Sb and the variable resistor R1 and R2 in the sub gain control unit 30. When the volume of the sound signal is increased, the switch control module 43 controls the change-over switch Sa to be turned on according to the switch controlling signal, and increases the variable resistor R1 of the boosting circuit 31. When the volume of the sound signal is decreased, the switch control module 43 controls the change-over switch Sb according to the switch controlling signal, and adjusts the operation of the variable resistor R2 of the decaying circuit 32.

The main clock generator 44 is used for providing the main clock signals to each module in the logic control unit 40. Because the operation mechanism of the clock signal is a widely-used technique in the field of the present invention, the theory would not be described here. The sub clock generator 45 generates the sub clock signal according to the single-conversion time parameter and the single-conversion section parameter obtained by the decoding module 41, and the sub clock signal is transmitted to the switch control module 43. In this way, the switch control module 43 is operated according to the sub clock signal in order to control the operation of the sub gain control unit 30.

It has to be noted here that when the adjusting magnitude required by the adjustment command signal is larger than a maximum gain range of the sub gain control unit 30, the switch control module 43 would control the main gain control unit 20 and the sub gain control unit 30 to execute the procedure of adjusting the sound signal repeatedly, and thereby transforming the sound signal into the converted signal. Besides, before the main gain control unit 20 and the sub gain control unit 30 finish the adjustment, the switch control module 43 would not receive new controlling signals.

Figure 3:
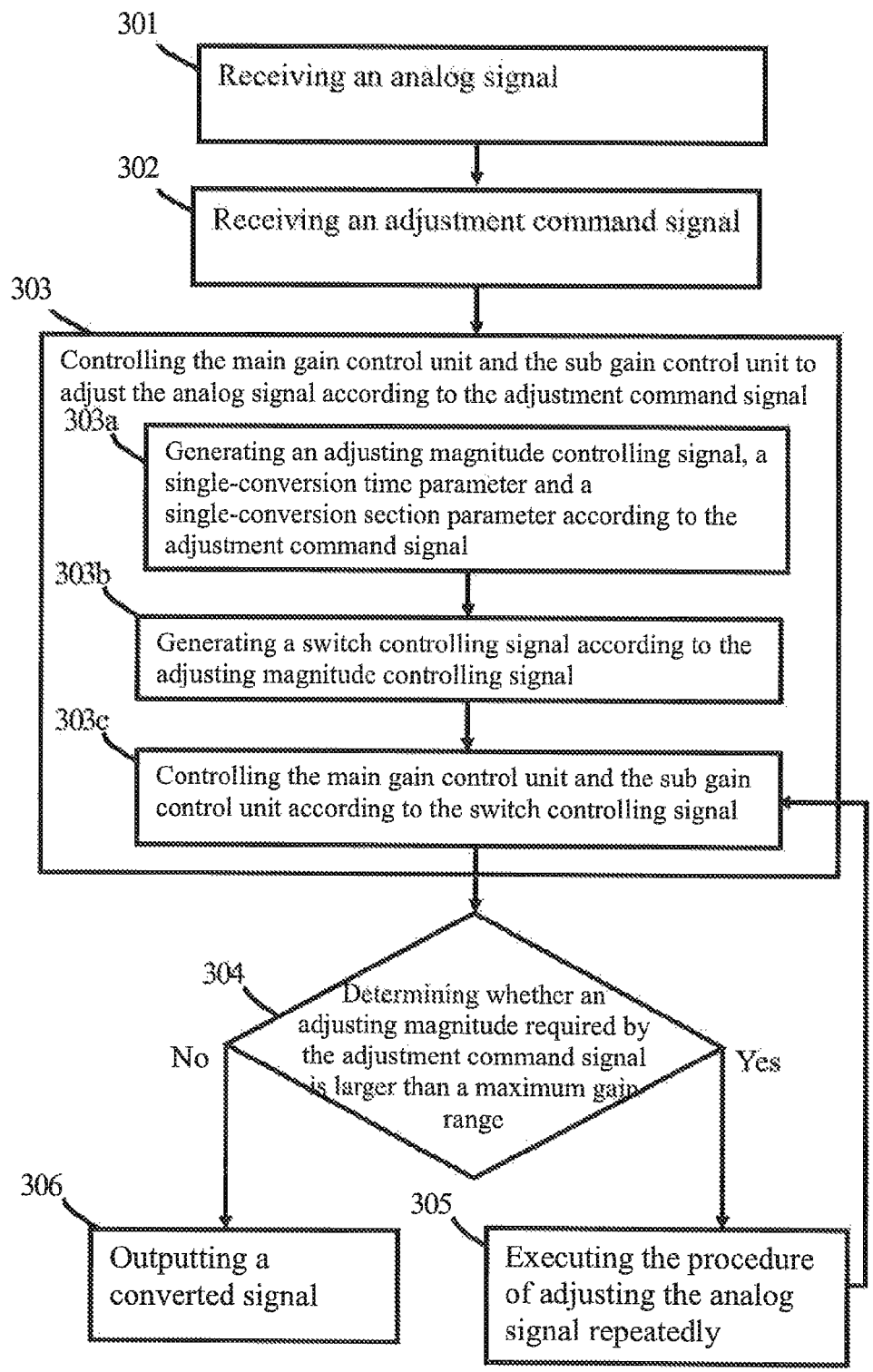
FIG. 3 is a flow chart of the gain controlling method of the present invention.

Next please refer to FIG. 3, which is a flow chart of the gain controlling method in accordance with the present invention. It has to be noted here that though the following description takes the sound playing system 1 having the gain controlling system 10 as an example to explain the gain controlling method of the present invention, the gain controlling method of the present invention is not limited to be used in the gain controlling system 10.

First, the step 301 is performed: receiving an analog signal.

First, the gain controlling system 10 receives the analog signal from the signal input end 2, i.e. the sound signal to be adjusted.

Next, the step 302 is performed: receiving an adjustment command signal.

Next, if the user wants to adjust the volume of the sound signal, the user could give the command through the command input end 3 so as to enter the adjustment command signal into the gain controlling system 10. The adjustment command signal is used for adjusting the adjusting magnitude of the sound signal.

Next, the step 303 is performed: controlling the main gain control unit and the sub gain control unit to adjust the analog signal according to the adjustment command signal.

After the gain controlling system 10 receives the adjustment command signal from the command input end 3, the adjustment command signal would be transmitted to the logic control unit 40, and the logic control unit 40 would then control the main gain control unit 20 and the sub gain control unit 30 to adjust the sound signal.

Namely, in the preferred embodiment of the present invention, the gain controlling system 10 would first perform the step 303a: generating an adjusting magnitude controlling signal, a single-conversion time parameter and a single-conversion section parameter according to the adjustment command signal.

After receiving the adjustment command signal, the decoding module 41 in the logic control unit 40 would first decode the adjustment command signal so as to generate the adjusting magnitude controlling signal, the single-conversion time parameter and the single-conversion section parameter according to the adjustment command signal.

Next, the step 303b is performed: generating a switch controlling signal according to the adjusting magnitude controlling signal.

Next the gain determining module 42 in the logic control unit 40 would generate the switch controlling signal according to the adjusting magnitude controlling signal. The switch controlling signal includes the volume of the sound signal to be increased or decrease, and the gain magnitude to be executed by the main gain control unit 20.

Next, the step 303c is performed: controlling the main gain control unit and the sub gain control unit according to the switch controlling signal.

Next, the switch control module 43 controls the main gain control unit 20 and the sub gain control unit 30 according to the switch controlling signal. At the same time in the step 303c, the sub clock generator 45 would also generate a sub clock signal according to the single-conversion time parameter and the single-conversion section parameter obtained by the decoding module 41 in the step 303a, so as to control the switch control module 43.

Next, the step 304 is performed: determining whether an adjusting magnitude required by the adjustment command signal is larger than a maximum gain range.

When the main gain control unit 20 and the sub gain control unit 30 is controlled to operate by the switch controlling signal generated by the gain determining module 42, at the same time, the gain determining module 42 would also determine whether the adjusting magnitude required by the adjustment command signal is larger than the maximum gain range of the sub gain control unit 30.

Figure 4A:
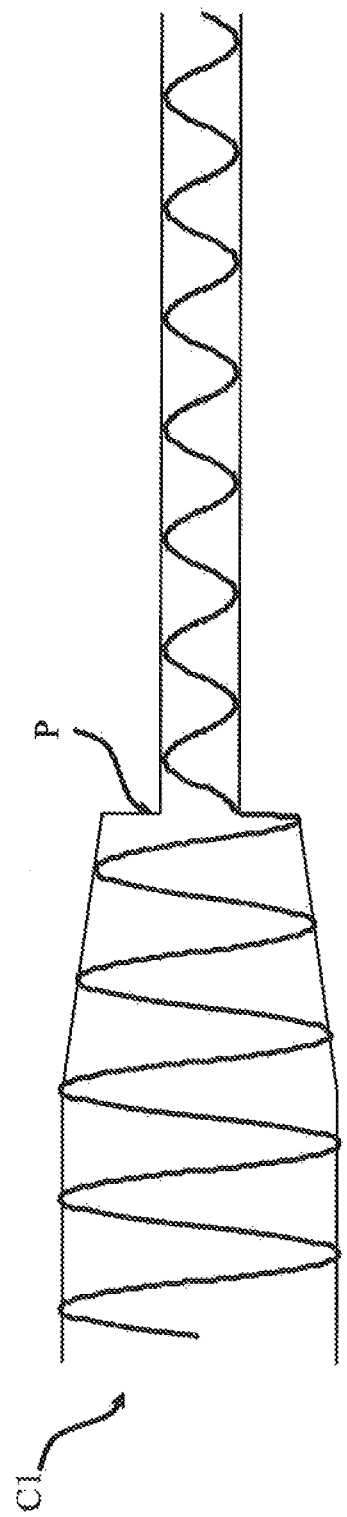
FIG. 4A is a gain curve diagram showing a higher gain change magnitude embodiment of the present invention.

Here please refer to FIG. 4A, which is a gain curve diagram of a higher gain change magnitude embodiment in accordance with the present invention.

If the alteration magnitude required by the adjustment command signal is larger than the maximum gain range, it means that the process procedure is executed only once by the main gain control unit 20 and the sub gain control unit 30, and next the gain value is directly outputted. Therefore, the gain curve C1 obtained is shown as FIG. 4A, there is still gap point P still being generated in on the gain curve C1. Thus, under this situation, the user would still hear the noise, and the main goal of the present invention, i.e. to get rid of the noise, could not be achieved.

Thus, if the alteration magnitude required is larger than a second gain change magnitude, the step 305 would be performed: executing the procedure of adjusting the analog signal repeatedly.

If the adjusting magnitude required by the adjustment command signal is larger than the second gain change magnitude, the gain determining module 42 would control the switch control module 43 not to receive other controlling signals, i.e. the process of the method jumps back to the step 303 (or step 303c) and again the main gain control unit 20 and the sub gain control unit 30 is controlled to execute the procedures of adjusting the sound signal.

Next if the required adjusting magnitude is smaller than the second gain change magnitude, then the step 306 would further be performed: outputting a converted signal.

If the gain determining module 42 determines that the adjusting magnitude required by the adjustment command signal is smaller than the second gain change magnitude, the gain determining module 42 would not repeatedly require the switch control module 43 controlling the main gain control unit 20 and the sub gain control unit 30, and the converted signal could be outputted to the signal output end 4.

Figure 4B:
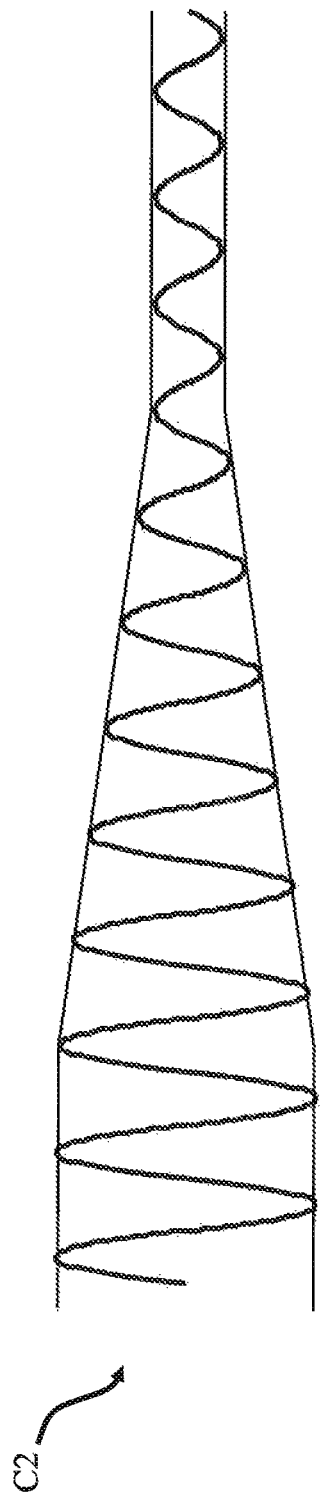
FIG. 4B is a gain curve diagram of a preferred embodiment of the present invention.

By repeatedly performing the procedures from step 303 to step 305, the result would finally come out as shown in FIG. 4B, which is a gain curve diagram of a preferred embodiment in accordance with the present invention.

Figure 1A:
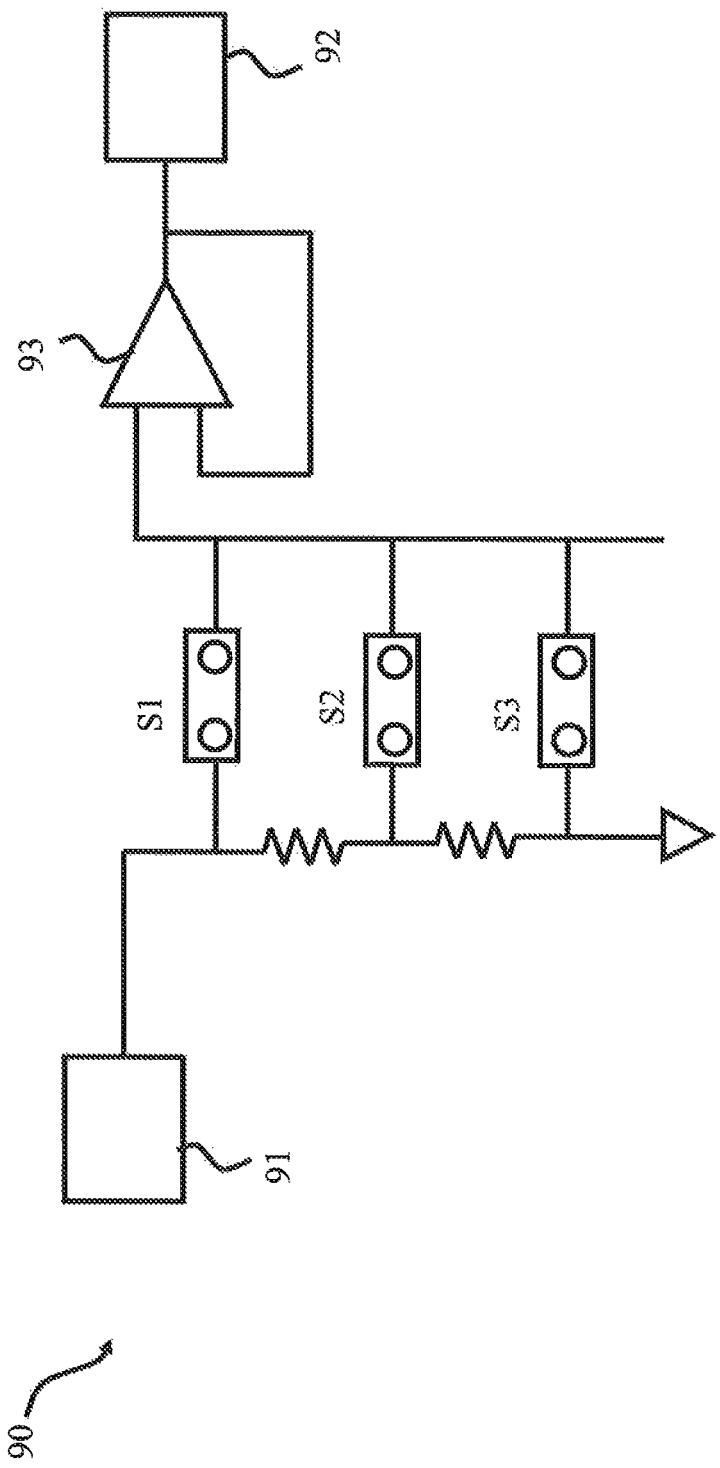
FIG. 1A is a structural schematic diagram of the gain controlling system of the prior art.
Figure 1B:
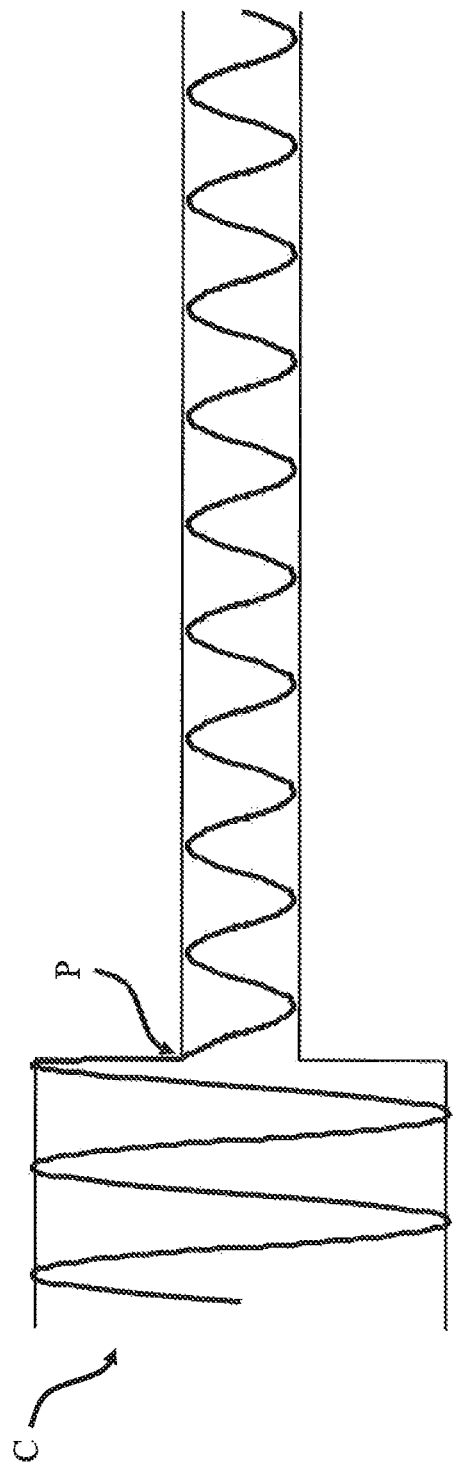
FIG. 1B is a gain curve diagram showing a higher gain change magnitude embodiment of the prior art.

By repeatedly performing the procedures of controlling the main gain control unit 20 and the sub gain control unit 30 to adjust the sound signal, the gain curve C2 shown in FIG. 4B could be obtained. Compare with the prior art shown in FIG. 1B or FIG. 4A, the waveform of the gain curve C2 is changed slowly and without generating the gap. Thus, the user would not hear the noise when the gain controlling system 10 adjusts the gain of the sound signal.

It has to be noted here that the gain controlling method is not limited within the aforementioned step sequence, in order to achieve the object of the present invention, the aforementioned step sequence could also be changed.

By the gain controlling system 10 and the gain controlling method of the present invention, the gain change could be effectively slowed down and thus the user would not sense the noise, and the gain controlling system 10 does not need a complicated detecting circuit or a feedback circuit.

As described above, the objectives, means, and effectiveness of the present invention are different from the characteristics of the prior art. It would be appreciated if the patent application could be issued as early as possible to benefit society. It should be also noted that the embodiments described above are for illustrative purposes; the disclosed claims of the present invention should be within the range of the accompanying claims and should not be limited to the embodiments described above.

What is claimed is:

1. A gain controlling system, used for adjusting a gain of an analog signal according to an adjustment command signal inputted from a command input end, the gain controlling system comprising:
   a main gain control unit, having a first step-by-step adjusting magnitude;
   a sub gain control unit, electrically connected with the main gain control unit and having a second step-by-step adjusting magnitude; wherein the second step-by-step adjusting magnitude of the sub gain control unit is smaller than the first step-by-step adjusting magnitude of the main gain control unit; wherein the analog signal is inputted to the main gain control unit and the sub gain control unit; and
   a logic control unit, electrically connected with the main gain control unit and the sub gain control unit, for controlling the main gain control unit and the sub gain control unit to adjust the analog signal according to the adjustment command signal, and transforming the analog signal into a converted signal; wherein after the adjustment command signal is inputted, the logic control unit further determines whether an adjusting magnitude required by the adjustment command signal is larger than a maximum gain range of the sub gain control unit; if yes, the logic control unit controlling the main gain control unit and the sub gain control unit to execute the procedure of adjusting the analog signal repeatedly.

2. The gain controlling system as claimed in claim 1, wherein the logic control unit further comprises a decoding module electrically connected with the command input end, and the decoding module is used for decoding the adjustment command signal to generate an adjusting magnitude controlling signal, a single-conversion time parameter, and a single-conversion section parameter.

3. The gain controlling system as claimed in claim 2, wherein the logic control unit comprises:
   a gain determining module, electrically connected with the decoding module, the gain determining module being used for generating a switch controlling signal according to the adjusting magnitude controlling signal; and
   a switch controlling module, electrically connected with the gain determining module, the switch controlling module being used for switching the main gain control unit and the sub gain control unit according to the switch controlling signal, so as to transform the analog signal into the converted signal.

4. The gain controlling system as claimed in claim 3, wherein:
   the sub gain control unit further comprises a boosting circuit and a decaying circuit;
   the gain determining module determines whether the analog signal is to be boosted or decayed according to the adjusting magnitude controlling signal, so as to generate the switch controlling signal for switching the boosting circuit or the decaying circuit.

5. The gain controlling system as claimed in claim 2, wherein the logic control unit comprises:
   a sub clock generator, used for generating a sub clock signal according to the single-conversion time parameter and the single-conversion section parameter, and the switch controlling module controlling the sub gain control unit according to the sub clock signal.

6. The gain controlling system as claimed in claim 1, wherein the analog signal is a sound signal.

7. A gain controlling method, adapted in a gain controlling system for adjusting the gain of one analog signal, the gain controlling system comprising a main gain control unit and a sub gain control unit; the method comprising the following steps:
   receiving the analog signal;
   receiving an adjustment command signal, wherein the adjustment command signal is used for adjusting the alteration magnitude of the analog signal;
   controlling the main gain control unit and the sub gain control unit to adjust the analog signal according to the adjustment command signal;

determines whether an alteration magnitude required by the adjustment command signal is larger than a maximum gain range of the sub gain control unit;

if yes, controlling the main gain control unit and the sub gain control unit to adjust the analog signal repeatedly; and if no, outputting a converted signal.

8. The gain controlling method as claimed in claim 7, further comprising the following steps:

generating an adjusting magnitude controlling signal, a single-conversion time parameter, and a single-conversion section parameter according to the adjustment command signal.

9. The gain controlling method as claimed in claim 8, further comprising the following steps:

generating a switch controlling signal according to the adjusting magnitude controlling signal; and switching the main gain control unit and the sub gain control unit according to the switch controlling signal, so as to transform the analog signal into the converted signal.

10. The gain controlling method as claimed in claim 9, wherein the sub gain control unit further comprises a boosting circuit and a decaying circuit, and the method further comprises the following steps:

determining whether the analog signal according to the alteration magnitude controlling signal is to be boosted or decayed; and generating the switch controlling signal for selecting the boosting circuit or the decay circuit to be executed.

11. The gain controlling method as claimed in claim 8, further comprising the following steps:

generating a sub clock signal according to the single-conversion time parameter and the single-conversion section parameter, so as to control the sub gain control unit.

12. A sound playback system, comprising:

a signal input end, used for allowing a sound signal to be inputted;

a command input end, used for providing a user to input an adjustment command signal;

a gain controlling system, electrically connected with the signal input end and the command input end, used for adjusting the gain of the sound signal according to the adjustment command signal inputted from the command input end; the gain controlling system comprising:

a main gain control unit, having a first step-by-step adjusting magnitude;

a sub gain control unit, electrically connected with the main gain control unit and having a second step-by-step adjusting magnitude; wherein the second step-by-step adjusting magnitude of the sub gain control unit is smaller than the first step-by-step adjusting magnitude of the main gain control unit; wherein the sound signal is inputted to the main gain control unit and the sub gain control unit; and a logic control unit, electrically connected with the main gain control unit and the sub gain control unit, for controlling the main gain control unit and the sub gain control unit to adjust the sound signal according to the adjustment command signal, and transforming the sound signal into a converted signal; wherein after the adjustment command signal is inputted, the logic control unit further determines whether an adjusting magnitude required by the adjustment command signal is larger than a maximum gain range of the sub gain control unit; if yes, the logic control unit controls the main gain control unit and the sub gain control unit to execute the procedure of adjusting the analog signal repeatedly; and a signal output end, electrically connected with the gain controlling system, used for outputting the converted signal.

13. The sound playback system as claimed in claim 12, wherein the logic control unit further comprises a decoding module electrically connected with the command input end, and the decoding module is used for decoding the adjustment command signal to generate an adjusting magnitude controlling signal, a single-conversion time parameter, and a single-conversion section parameter.

14. The sound playback system as claimed in claim 13, wherein the logic control unit comprises:

a gain determining module, electrically connected with the decoding module, the gain determining module being used for generating a switch controlling signal according to the adjusting magnitude controlling signal; and a switch controlling module, electrically connected with the gain determining module, the switch controlling module being used for switching the main gain control unit and the sub gain control unit according to the switch controlling signal, so as to transform the sound signal into the converted signal.

15. The sound playback system as claimed in claim 14, wherein:

the sub gain control unit further comprises a boosting circuit and a decay circuit;

the gain determining module determines whether the sound signal according to the alteration magnitude controlling signal is to be boosted or decayed, so as to generate the switch controlling signal for switching the boosting circuit or the decay circuit.

16. The sound playback system as claimed in claim 13, wherein the logic control unit comprises:

a sub clock generator, used for generating a sub clock signal according to the single-conversion time parameter and the single-conversion section parameter, and the switch controlling module controls the sub gain control unit according to the sub clock signal.

* * * * *